United States Patent
Schulz et al.

(10) Patent No.: US 11,929,734 B2
(45) Date of Patent: Mar. 12, 2024

(54) SURFACE ACOUSTIC WAVE RESONATOR WITH PISTON MODE DESIGN AND ELECTROSTATIC DISCHARGE PROTECTIONS

(71) Applicant: RF360 SINGAPORE PTE, LTD., Singapore (SG)

(72) Inventors: Volker Schulz, Munich (DE); Philipp Michael Jaeger, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 499 days.

(21) Appl. No.: 17/161,999

(22) Filed: Jan. 29, 2021

(65) Prior Publication Data

US 2022/0247379 A1 Aug. 4, 2022

(51) Int. Cl.
*H03H 9/25* (2006.01)
*H03H 3/08* (2006.01)
*H03H 9/02* (2006.01)
*H03H 9/145* (2006.01)
*H03H 9/64* (2006.01)

(52) U.S. Cl.
CPC ............... *H03H 9/25* (2013.01); *H03H 3/08* (2013.01); *H03H 9/02842* (2013.01); *H03H 9/02984* (2013.01); *H03H 9/14541* (2013.01); *H03H 9/6406* (2013.01)

(58) Field of Classification Search
CPC ........ H03H 9/25; H03H 3/08; H03H 9/02842; H03H 9/02984; H03H 9/14541; H03H 9/6406; H03H 9/02858; H03H 9/14532; H03H 9/1457; H03H 9/02921
USPC .......................................... 333/133, 193–196
See application file for complete search history.

(56) References Cited

U.S. PATENT DOCUMENTS

| 10,418,970 | B2 * | 9/2019 | Daimon ............... H03H 9/1457 |
| 2012/0161577 | A1 | 6/2012 | Abbott et al. |
| 2017/0047905 | A1 | 2/2017 | Araki et al. |
| 2017/0244378 | A1 | 8/2017 | Kim et al. |
| 2018/0054179 | A1 | 2/2018 | Gamble et al. |

(Continued)

FOREIGN PATENT DOCUMENTS

WO 2021013568 A1 1/2021

OTHER PUBLICATIONS

International Search Report and Written Opinion—PCT/EP2022/051466—ISA/EPO—dated May 25, 2022.

*Primary Examiner* — Rakesh B Patel
*Assistant Examiner* — Jorge L Salazar, Jr.
(74) *Attorney, Agent, or Firm* — Patterson + Sheridan LLP

(57) ABSTRACT

Certain aspects of the present disclosure provide a surface acoustic wave (SAW) resonator with piston mode design and electrostatic discharge (ESD) protections. An example electroacoustic device generally includes a piezoelectric material and a first electrode structure disposed above the piezoelectric material. The first electrode structure comprises first electrode fingers arranged within an active region having a first region and a second region. At least one of the first electrode fingers has at least one of a different width or a different height in the first region than in the second region, and the first electrode fingers comprise a first electrode finger that has a width or height in the second region that is less than a corresponding width or height of the at least one of the first electrode fingers in the second region.

29 Claims, 10 Drawing Sheets

(56) References Cited

U.S. PATENT DOCUMENTS

2019/0222195 A1 7/2019 Matsuda et al.
2020/0304097 A1 9/2020 Suzuki et al.

\* cited by examiner

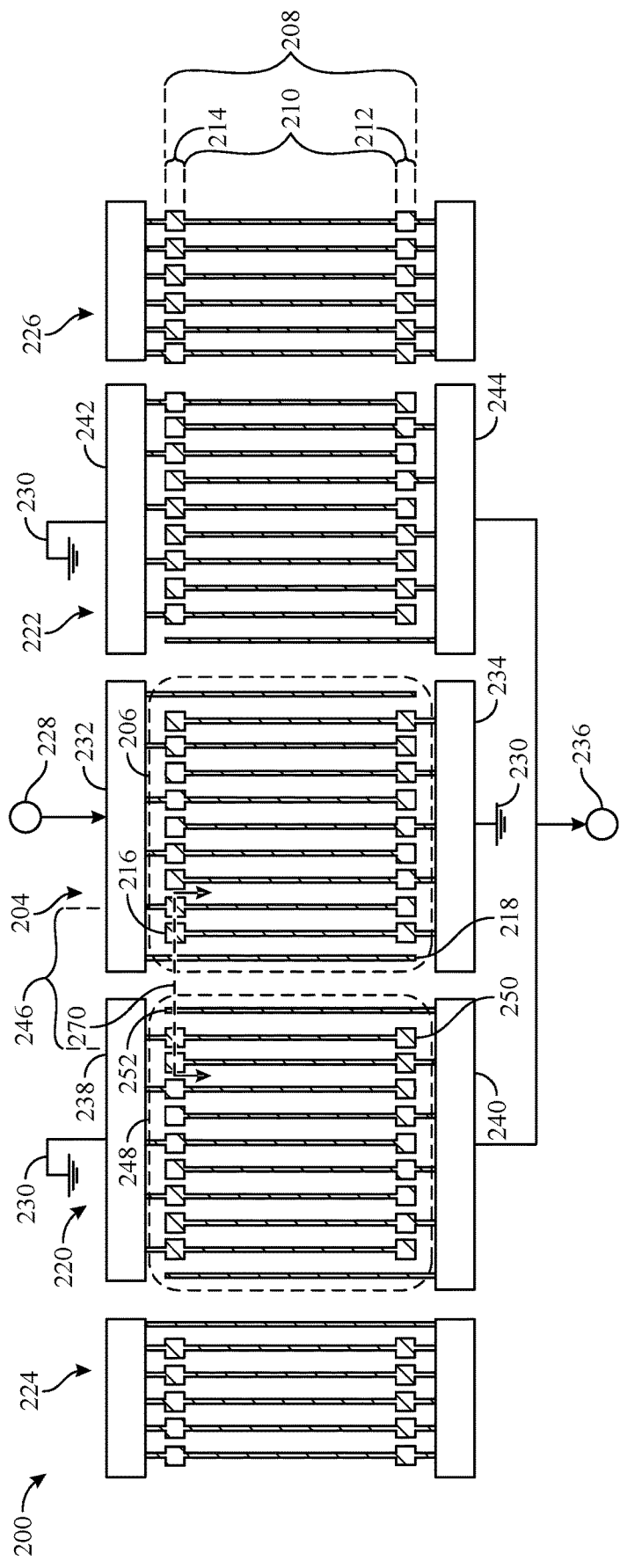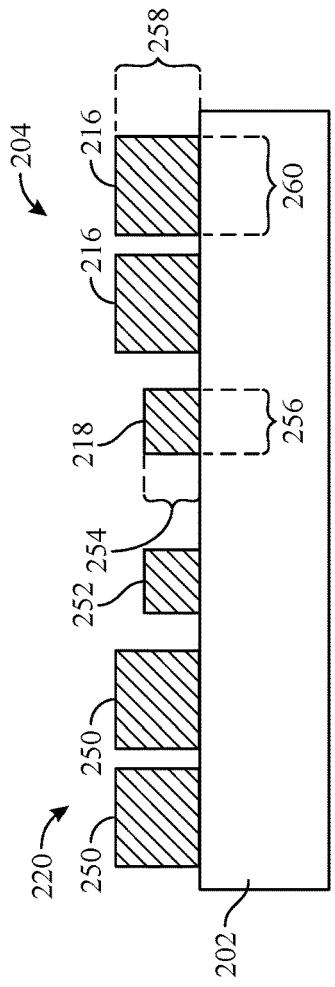
FIG. 2A
FIG. 2B

SURFACE ACOUSTIC WAVE RESONATOR WITH PISTON MODE DESIGN AND ELECTROSTATIC DISCHARGE PROTECTIONS

BACKGROUND

Field of the Disclosure

Aspects of the present disclosure relate to electronic devices, and more particularly, to a surface acoustic wave (SAW) resonator with piston mode design and electrostatic discharge (ESD) protections.

Description of Related Art

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. Wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., IEEE 802.11), and the like.

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 500 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

As the number of frequency bands used in wireless communications increases and as the desired frequency band of filters widen, the performance of acoustic filters increases in importance to reduce resistive losses, increase attenuation of out-of-band signals, and increase overall performance of electronic devices. Acoustic filters with improved performance are therefore sought after.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include an electroacoustic device having a desirable electrostatic discharge (ESD) strength.

Certain aspects of the present disclosure can be implemented in an electroacoustic device. The electroacoustic device generally includes a piezoelectric material and a first electrode structure disposed above the piezoelectric material. The first electrode structure comprises first electrode fingers arranged within an active region having a first region and a second region. At least one of the first electrode fingers has at least one of a different width or a different height in the first region than in the second region, and the first electrode fingers comprise a first electrode finger that has a same thickness in the first region and the second region.

Certain aspects of the present disclosure can be implemented in an electroacoustic device. The electroacoustic device generally includes a piezoelectric material, a first interdigitated electrode structure, and a second interdigitated electrode structure. The first interdigitated electrode structure is disposed above the piezoelectric material. The first electrode structure comprises first electrode fingers arranged within an active region having a first region and a second region. At least one of the first electrode fingers has at least one of a different width or a different height in the first region than in the second region, and the first electrode fingers comprise a first electrode finger that has a width or height in the second region that is less than a corresponding width or height of the at least one of the first electrode fingers in the second region. The second interdigitated electrode structure is disposed above the piezoelectric material and disposed adjacent to the first electrode structure. The second electrode structure comprises second electrode fingers arranged within the active region. At least one of the second electrode fingers has at least one of a different width or a different height in the first region than in the second region, and the second electrode fingers comprise a second electrode finger disposed adjacent to the first electrode finger of the first electrode structure.

Certain aspects of the present disclosure can be implemented as a method of fabricating an electroacoustic device. The method generally includes forming a first electrode structure above a piezoelectric material, wherein forming the first electrode structure comprises forming first electrode fingers arranged within an active region having a first region and a second region. Forming the first electrode fingers comprises forming at least one of the first electrode fingers with at least one of a different width or a different height in the first region than in the second region, and forming a first electrode finger having a width or height in the second region that is less than a corresponding width or height of the at least one of the first electrode fingers in the second region.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

FIG. 2A is a diagram illustrating an example electroacoustic device having specific electrode fingers without piston-mode hammer heads, in accordance with certain aspects of the present disclosure.

FIG. 2B is a diagram illustrating a cross-section of the example electroacoustic device of FIG. 2A, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Aspects of the present disclosure provide an electroacoustic device having a piston mode with electrostatic discharge (ESD) protections.

Electroacoustic devices such as surface acoustic wave (SAW) resonators, which employ interdigital electrode structures disposed on a surface of a piezoelectric material, are being designed to cover more frequency ranges (e.g., 500 MHz to 7 GHz), to have higher bandwidths, and to have improved efficiency and performance. In general, certain SAW resonators are designed to cause propagation of an acoustic wave in a particular direction through the piezoelectric material (e.g., main acoustic wave mode). However, due to the nature of the particular piezoelectric material used and the way the piezoelectric material is excited by the electrode structure, at least some undesired acoustic wave modes in other directions may be generated. For example, transversal acoustic wave modes that are transverse to the direction of the main (e.g., fundamental) acoustic wave mode may be excited in the piezoelectric material. These transversal acoustic wave modes may be undesirable and have an adverse impact on resonator performance (e.g., introducing ripples in the passband of the filter). By adjusting characteristics of the electrode structure, acoustic velocities in various transversal regions may be controlled in a manner to reduce transversal acoustic wave modes. For example, a piston mode waveguide may be arranged along the electrode structures to suppress transverse disturbances, as further described herein with respect to FIGS. 2A and 2B.

Example Electroacoustic Device

Figure 1A:
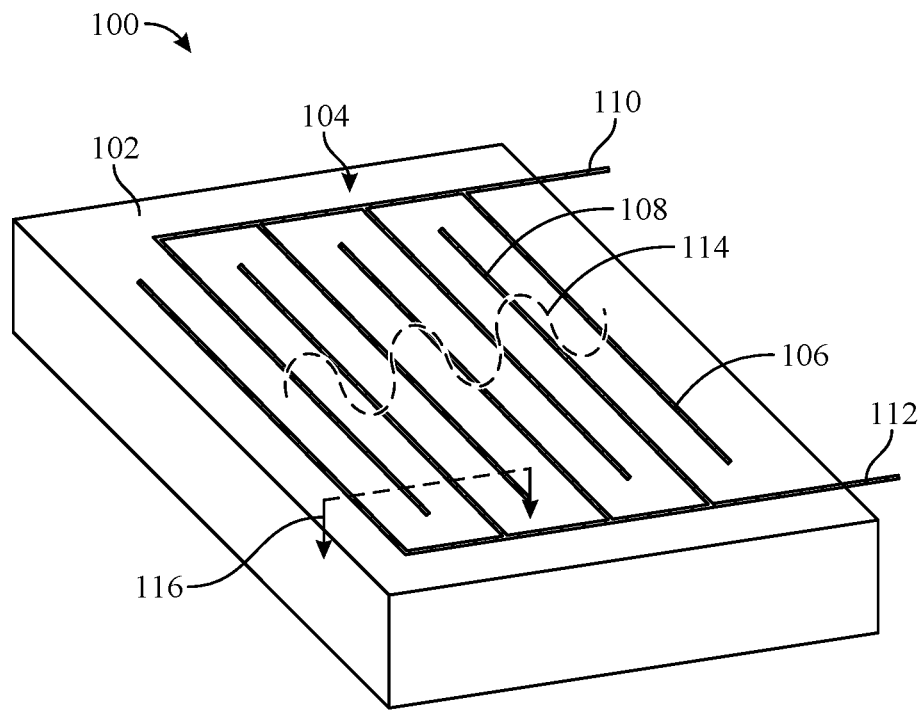
FIG. 1A is a diagram conceptually illustrating an example electroacoustic device, in accordance with certain aspects of the present disclosure.

FIG. 1A is a diagram illustrating a perspective view of an example electroacoustic device 100. The electroacoustic device 100 may be configured as or be a portion of a SAW resonator. In certain descriptions herein, the electroacoustic device 100 may be referred to as a SAW resonator. However, there may be other electroacoustic device types that may be constructed based on the principles described herein. In certain cases, a wireless communication apparatus may include the SAW resonator, for example, as further described herein with respect to FIGS. 7, 9, and 10.

The electroacoustic device 100 includes an electrode structure 104, that may be referred to as an interdigital transducer (IDT), on the surface of a piezoelectric material 102. The electrode structure 104 generally includes first and second comb-shaped electrode structures (conductive and generally metallic) with first and second electrode fingers 106, 108 extending from two bus bars 110, 112 towards each other and arranged in an interlocking manner in between the two bus bars 110, 112 (e.g., arranged in an interdigitated manner). An electrical signal excited in the electrode structure 104 (e.g., applying an AC voltage) is transformed into an acoustic wave 114 that propagates in a particular direction via the piezoelectric material 102. The acoustic wave 114 is transformed back into an electrical signal and provided as an output. That is, applying an electrical signal to the piezoelectric material 102 through the first electrode fingers 106 transduces the electrical signal to the acoustic wave 114 in the piezoelectric material 102. The acoustic wave 114 is transformed back into an electrical signal via the second electrode fingers 108, which provides the electrical signal as an output. That is, the acoustic wave 114 is transduced into an electrical signal via the second electrode fingers 108.

In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the bus bars).

Figure 1B:
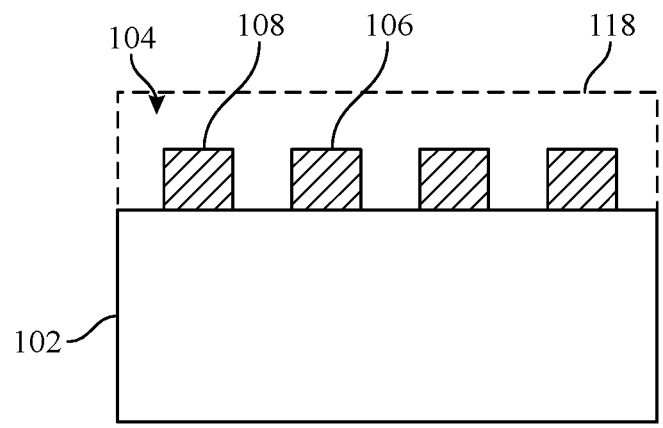
FIG. 1B is a diagram illustrating a cross-section of the example electroacoustic device of FIG. 1A, in accordance with certain aspects of the present disclosure.

FIG. 1B is a diagram of a side view of the electroacoustic device 100 of FIG. 1A along a cross-section 116 shown in FIG. 1A. The electroacoustic device 100 is illustrated by a simplified layer stack including a piezoelectric material 102 with an electrode structure 104 disposed on the piezoelectric material 102. The electrode structure 104 is conductive and generally formed from metallic materials. The electrode structure 104 may include an electrically conductive material such as a metal or metal alloy including aluminum (Al), chromium (Cr), cobalt (Co), copper (Cu), gold (Au), molybdenum (Mo), platinum (Pt), ruthenium (Ru), tantalum (Ta), titanium (Ti), tungsten (W), or a combination thereof.

The piezoelectric material 102 may be formed from a variety of materials including a piezoelectric material such as aluminum nitride (AlN), zinc oxide (ZnO), a quartz crystal (such as lithium tantalate ($LiTaO_3$) or lithium niobite ($LiNbO_3$)), doped variants of these, or other suitable piezoelectric materials.

It should be appreciated that more complicated layer stacks including layers of various materials may be possible within the stack. For example, optionally, a temperature compensation layer 118 denoted by the dashed lines in FIG. 1B may be disposed above the electrode structure 104. The piezoelectric material 102 may be extended with multiple interconnected electrode structures disposed thereon to form a multi-resonator filter or to provide multiple filters. In certain cases, the electroacoustic device 100 may be implemented as a thin-film SAW resonator, where the layer stack may include a substrate (which may have a trap rich layer), a compensation layer, a thin piezoelectric layer, and the electrode structure disposed above the piezoelectric layer.

While not illustrated, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

In certain cases, a so-called "piston mode waveguide" may be formed from two waveguide regions arranged along the electrode fingers where an internal region is arranged between the two waveguide regions. As the angles and frequency position of the transversal acoustic wave modes depend on the directional acoustic wave velocity, in an aspect, the transversal velocity profile within the acoustic track can be designed in such a way to reduce transversal acoustic wave modes and promote excitation of the main or fundamental mode. In particular, the electrode structure (and potentially other layers) can be adjusted in different regions of the electrode structure to adjust the transversal velocity profile within the acoustic track to reduce transversal acoustic modes (e.g., effectively forming a transversal acoustic waveguide). In certain aspects, an acoustic velocity may correspond to an acoustic velocity of the fundamental mode of the electroacoustic device, although the velocity may be understood more generally in certain respects to capture or relate to different modes.

The waveguide regions are provided at either outer boundary of the internal region where the electrode fingers overlap. A structural characteristic in the waveguide regions different than in the internal region is provided to create a region of the electroacoustic device aligned with the waveguide regions that has a reduced acoustic wave velocity, in particular to be lower than an acoustic wave velocity in a region defined by the internal region. Such structural characteristics may include widening the electrode fingers in the waveguide regions and/or increasing the height of the electrode fingers in the waveguide regions, but many implementations are possible. That is, in the waveguide regions, the electrode fingers may have a greater width and/or greater height than in the internal region, for example, as depicted in FIG. 2A. The different structural difference of the electrode fingers along the waveguide regions may be referred to as "hammer heads." In certain cases, the hammer heads may be taller (i.e., have a greater height) in the waveguide regions than the height of the electrode finger in the internal region, but may not necessarily be wider in the waveguide regions than the width of the electrode finger in the internal region. SAW resonators with a piston mode design may have a smaller distance between the hammer heads of interdigital fingers compared to the distance between electrode fingers in the internal region. Adjacent hammer heads of two electrode fingers may have different electrical potentials, for example, due to a transition between interdigital transducers (IDTs) or a transition between an IDT and a reflector.

During the assembly process of surface acoustic wave (SAW) resonators into multi-die-packages (MDP) and modules, as well as during the handling of these resonators by the end customer, electrical voltages may be present (for example, due to assembly activities) and can lead to ESD within the resonator structure and, consequently, to irreversible damage of the filter. With respect to SAW resonators with a piston mode waveguide, the interdigital electrode structures may have a lower ESD strength (or a higher ESD sensitivity) due to the shorter distance between two adjacent hammer heads. In certain aspects, the region between two adjacent hammer heads may define the smallest distance between adjacent fingers with different electrical potentials and, thus, may exhibit the highest electrical field strength. The adjacent hammer heads with different electrical potentials may provide a higher risk for permanent damage to the resonator during the module assembly process or during handling by the end user due to ESD. The ESD between hammer heads may lower the fabrication yield of the SAW resonators due to ESD damage during fabrication and/or contribute to a higher number of returns performed by the end user due to ESD damage during handling by the end user.

For dual-mode-SAW (DMS) transducers, the distance between adjacent transducer elements determines the passband characteristic of the filter transfer function. This leads to small transducer-transducer distances for filters in the 2 GHz range and above (e.g., 240 nm) and, thus, to a drastically reduced strength against ESD of these specific filters. In certain cases, a resonator which is not directly connected to the input/output terminals of the filter can be responsible for irreversible damage of the filter due to ESD.

Certain aspects of the present disclosure relate to an electroacoustic device having specific electrode fingers without piston-mode hammer heads. For example, the adjacent electrode fingers of adjacent IDTs may be arranged without the hammer heads to enable a greater ESD strength. In certain cases, additional electrode fingers adjacent to the transition region between IDTs may also be formed without hammer heads. The electrode finger design described herein may enable an electroacoustic device (such as a SAW resonator) with a desirable ESD strength. As used herein, the ESD strength may refer to an ESD withstand voltage sensitivity, which is the maximum test voltage at which a device (e.g., an electroacoustic device) does not suffer damage during a machine model, charge device model, or human body model of ESD. For example, the electrode finger design described herein (e.g., with selective removal of piston-mode hammer heads from particular electrode fingers) may enable an increase in a withstand voltage during a machine model or human body model of ESD by at least a factor of three (such as from 50 V to 175 V or from 100 V to 425 V) compared to an electroacoustic device without this electrode finger design.

Example Electroacoustic Device with Selective Piston Mode Design

Aspects of the present disclosure provide selective withdrawal of one or more hammer heads of an electrode finger, for example, in transition regions of an electroacoustic device where electrode structures are arranged adjacent to each other (such as an IDT-IDT transition or an IDT-reflector transition) or along an IDT electrode track independent of a transition region. That is, the selective withdrawal of one or more hammer heads of an electrode finger may apply to transition regions but also may apply to a single IDT element by itself (where specific electrode fingers do not have hammer heads). In certain cases, the electrode fingers may be formed without a height extension in the specific transition regions where electrode fingers are formed without hammer heads. In certain cases, the specific transition regions may be selected in areas that exhibit a small distance between electrode fingers of different electrical potential. With the removal of one or more hammer heads, the distance between certain fingers may be increased, which in turn may lead to a desirable strength against ESD. The maximum possible increase in distance for a specific transducer area depends on how much the hammer head width exceeds the finger width (the difference is referred to as the "hammer head offset"). For example, a hammer head offset of 50 nm may be used for certain SAW resonators. Removal of the hammer head offset may lead to an increase in the distance between two fingers of 100 nm. For an exemplary receive filter, the distance was increased from 240 nm to 340 nm, which corresponds to an increase of 41%. For this specific receive filter, the withstand voltage increased from 50 V to 175 V for the machine model and from 100 V to 425 V for the human body model.

FIGS. 2A and 2B are diagrams illustrating an example electroacoustic device 200 having specific electrode fingers without piston-mode hammer heads, in accordance with certain aspects of the present disclosure. FIG. 2A is a diagram illustrating a top view of the electroacoustic device 200, and FIG. 2B is a diagram illustrating a side view of the electroacoustic device 200 along a cross-section 270 as shown in FIG. 2A.

The electroacoustic device 200 may include a piezoelectric material 202 (which is depicted in FIG. 2B) and a first electrode structure 204. In certain aspects, the electroacoustic device 200 may further include a second electrode structure 220, a third electrode structure 222, a fourth electrode structure 224, and a fifth electrode structure 226. While the example depicted in FIG. 2A is described herein with respect to there being five electrode structures to facilitate understanding, aspects of the present disclosure may also be applied to an electroacoustic device having at least two electrode structures. In certain cases, the electroacoustic device 200 may be a SAW resonator.

The first electrode structure 204 may be disposed above the piezoelectric material 202, for example, as depicted in FIG. 2B. The first electrode structure 204 may include first electrode fingers 206 arranged within an active region 208 having a first region 210 and a second region 212. In this example, the first electrode structure 204 is an IDT, such that the first electrode fingers 206 are arranged in an interdigitated manner, for example, as described herein with respect to the electroacoustic device 100 of FIG. 1A. In other cases, the first electrode structure 204 may be a reflector grating.

In aspects, the active region 208 may also have a third region 214. In aspects, the active region 208 may represent an area including a central region (e.g., the first region 210) arranged between two waveguide regions (e.g., the second region 212 and third region 214) along one or more electrode structures. In some aspects, the active region may be indicated by an overlap region of the interdigitating electrode fingers (e.g., of opposite polarity) and may correspond to an area in which acoustic waves propagating normal to the direction the electrode fingers extend are excited when an RF signal is applied to the electrode structure. The first region 210 may be arranged between the second region 212 and third region 214, such that the second region 212 and third region 214 may define where the piston mode waveguides are arranged along the various electrode structures (204, 220, 222, 224, 226) of the electroacoustic device 200. For example, at least one of the first electrode fingers 206 (referred to herein as a first hammer head electrode finger 216) has a different width and/or a different height in the first region 210 than in the second region 212, and in certain cases, the third region 214 as well. In certain cases, the width and/or height of the first hammer head electrode finger 216 may be greater in the second region 212 and third region 214 than in the first region 210. Expressed another way, hammer heads may be arranged in the second region 212 and third region 214 along the first hammer head electrode finger 216. The first hammer head electrode finger 216 may also have a greater height in the second region 212 and the third region 214 than in the first region 210, as further described herein with respect to FIG. 2B. In certain cases, the hammer head fingers may only have a greater width in the second region 212 and the third region 214 than in the first region 210. In other cases, the hammer head electrode fingers may only have a greater height in the second region 212 and the third region 214 than in the first region 210.

In aspects, a majority of the first electrode fingers 206 may have a greater width and a greater height in the second region 212 and the third region 214 than in the first region 210. In other words, a majority of the first electrode fingers 206 may have hammer heads arranged in the second region 212 and the third region 214, such that the first electrode structure 204 comprises a piston-mode electrode structure.

In aspects, the first electrode fingers 206 may include a first electrode finger 218 that has the same width and height in the first region 210 and the second region 212. In certain cases, the first electrode finger 218 may have the same width and height in the first region 210, the second region 212, and the third region 214, as well. The same width and height in the first region 210 and second region 212 leads to the first electrode finger 218 not having a hammer head in the second region 212. That is, the first electrode finger 218 may have a width or height in the second region 212 that is less than a corresponding width or height of the first hammer head electrode finger 216 in the second region 212. The lack of a hammer head along the first electrode finger 218 may enable a desirable ESD strength, especially between the first electrode structure 204 and the second electrode structure 220, in cases, where the first electrode finger 218 is adjacent to the second electrode structure 220.

In aspects, the second, third, fourth, and fifth electrode structures 220, 222, 224, 226 may be disposed above the piezoelectric material 202, for example, as a portion of the second electrode structure 220 is depicted above the piezoelectric material 202 in FIG. 2B. The second and third electrode structures 220, 222 may be disposed adjacent to the first electrode structure 204, such that the first electrode structure 204 is disposed between the second and third electrode structures 220, 222.

In certain aspects, the second and third electrode structures 220, 222 may be IDTs. In this example, an electrical input terminal 228 and a reference voltage 230 (e.g., a ground voltage) may be electrically coupled to opposite bus bars 232, 234 of the first electrode structure 204, and an electrical output terminal 236 and the reference voltage 230 may be electrically coupled to opposite bus bars (238, 240, 242, 244) of the second and third electrode structures 220, 222.

In aspects, the fourth and fifth electrode structures 224, 226 may be reflector gratings disposed adjacent to the second and third electrode structures 220, 222, respectively. In certain aspects, the fourth and fifth electrode structures 224, 226 may not be directly coupled to the input terminal 228, the reference voltage 230, or the output terminal 236. In this example, the fourth and fifth electrode structures 224, 226 are depicted as shorted reflector gratings. That is, the electrode fingers of each of the fourth and fifth electrode structures 224, 226 are electrically shorted together, for example, via bus bars. In certain cases, the electroacoustic device 200 may include one or more open reflector gratings. In contrast with a shorted reflector grating, the electrode fingers of an open reflector grating are not electrically coupled together via a bus bar.

In certain cases, electrode fingers without hammer heads may be arranged in transition regions along the electroacoustic device 200. As used herein, a transition region may refer to a region where electrode structures are arranged adjacent to each other, such as an IDT-IDT region or an IDT-reflector region. In aspects, a transition region may not be limited to the region between two adjacent electrode structures and may include some of the interior electrode fingers of the electrode structures. For example, the transition region 246 may include some of the first electrode fingers 206 belonging to the first electrode structure 204 and some of the second electrode fingers 248 belonging to the second electrode structure 220. In certain aspects, certain electrode fingers within a transition region may be formed without hammer heads to enable desirable ESD strength between electrode structures, for example, as further described herein with respect to FIGS. 5A-5E.

The second electrode structure 220 may include the second electrode fingers 248 arranged within the active region 208. In this example, the second electrode structure 220 is an IDT, such that the second electrode fingers 248 are arranged in an interdigitated manner. The transition region 246 is an IDT-IDT transition region. In certain cases, the second electrode structure 220 may be a reflector grating, such that the transition region 246 would be an IDT-reflector transition region.

The second region 212 and third region 214 may define where the piston mode waveguides are arranged along the second electrode structure 220. For example, at least one of the second electrode fingers 248 (referred to herein as a second hammer head electrode finger 250) has a different width and/or a different height in the first region 210 than in the second region 212, and in certain cases, the third region 214 as well. In certain cases, the width of the second hammer head electrode finger 250 may be greater in the second region 212 and third region 214 than in the first region 210. Expressed another way, hammer heads may be arranged in the second region 212 and third region 214 along the second hammer head electrode finger 250. The second hammer head electrode finger 250 may also have a greater height in the second region 212 and the third region 214 than in the first region 210, as further described herein with respect to FIG. 2B.

In aspects, a majority of the second electrode fingers 248 may have a greater width and/or a greater height in the second region 212 and the third region 214 than in the first region 210. In other words, a majority of the second electrode fingers 248 may have hammer heads arranged in the second region 212 and the third region 214, such that the second electrode structure 220 comprises a piston-mode electrode structure.

In aspects, the second electrode fingers 248 may include a second electrode finger 252 that has the same width and height in the first region 210 and the second region 212. In certain cases, the second electrode finger 252 may have the same width and height in the first region 210, the second region 212, and the third region 214, as well. The width and height in the first region 210 and second region 212 leads to the second electrode finger 252 not having a hammer head in the second region 212. That is, the second electrode finger 248 may have a width or height in the second region 212 that is less than a corresponding width or height of the second hammer head electrode finger 250 in the second region 212. The lack of a hammer head along the second electrode finger 252 may enable a desirable ESD strength, especially between the first electrode structure 204 and the second electrode structure 220, in cases, where the second electrode finger 252 is adjacent to the first electrode structure 204. In this example, the second electrode finger 252 is disposed adjacent to the first electrode finger 218, and both the first and second electrode fingers 218, 252 lack hammer heads in the second and third regions 212, 214. In certain cases, there may be various arrangements in which region the hammer head is missing, for example, as described herein with respect to FIGS. 5A-5E.

As shown, the electroacoustic device 200 includes other transition regions where adjacent electrode fingers of electrode structures may be configured without hammer heads as described herein with respect to the first electrode finger 218 and/or the second electrode finger 252. As used herein, adjacent electrode fingers may refer to the two electrode fingers of separate electrode structures that are adjacent to each other. In aspects, the electrode fingers may have various hammer head arrangements in these transition regions, for example, as further described herein with respect to FIGS. 5A-5E.

As shown in FIG. 2B, the first and second electrode fingers 218, 252 may have a first height 254 and a first width 256 in the third region 214, and the same or similar height and width may be exhibited in the first region and second regions 210, 212. In aspects, the first and second hammer head electrode fingers 216, 250 may have a second height 258 and a second width 260 in the third region 214, and the same or similar height and width may be exhibited in the second region 212. In the first region, the first and second hammer head electrode fingers 216, 250 may have the same height and width as the first height 254 and first width 256. In this example, the first height 254 and first width 256 may be smaller than the second height 258 and second width 260, respectively. In certain cases, the first height 254 may be less than, equal to, or greater than the second height 258, whereas the first width 256 may be smaller than the second width 260. In certain cases, the first width 256 may be less than, equal to, or greater than the second width 260, whereas the first height 254 may be smaller than the second height 258. Those of skill in the art will understand that the structural differences of the first and second electrode fingers 218, 252 with respect to the first and second hammer head electrode fingers 216, 250 illustrated in FIG. 2B are exemplary only. Additional or alternative structural differences may be used in addition to or instead of those illustrated. For example, either in addition to or in place of altering electrode fingers, additional dielectric layers (or layers of other materials) may be positioned in the regions to increase mass loading and impact the acoustic velocity profile in the regions. Other alternatives are also possible.

In aspects, the electrode fingers that do not have hammer heads may be selected based on various factors or criteria. As an example, the electrode fingers may be selected based on their electric potentials or the spacing between electrode structures. In aspects, the adjacent electrode fingers (e.g., the electrode fingers 218, 252) of electrode structures may be coupled to different voltages, which may lead to an increased probability of ESD. For example, the first electrode finger 218 may be coupled to a first node configured to have a first voltage (such as the input terminal 228), and the second electrode finger 252 may be coupled to a second node configured to have a second voltage (such as the output terminal 236). The first voltage may be different from the second voltage, and in certain cases, the first and second voltages may be different from the reference voltage 230 (e.g., ground voltages). For example, the first electrode fingers 206 may include a third electrode finger (e.g., the first hammer head electrode finger 216) arranged adjacent to the first electrode finger 218 and coupled to a third node configured to have a reference voltage (e.g., the reference voltage 230), where the reference voltage may be different from the first voltage and the second voltage. In other words, the transition region for the electrode fingers configured without one or more hammer heads may be where adjacent electrode fingers of the electrode structures (e.g., the first electrode structure 204 and second electrode structure 220) have a different voltage, and in some cases, the different voltages may not be a reference voltage, such as ground.

In certain cases, within certain transition regions (e.g., the transition region 246), a specific region between two electrode structures (e.g., the first electrode structure 204 and the second electrode structure 220) may have a shorter distance than the distances between adjacent electrode fingers within the electrode structures. This specific type of transition region may lead to undesirable ESD strengths without specific electrode fingers configured to improve the ESD strength as described herein. The electrode fingers in such a transition region may be candidates for being formed without one or more piston-mode hammer heads, and at least one of the electrode fingers in the transition region may be formed without one or more piston-mode hammer heads. For example, the first electrode fingers 206 of the first electrode structure 204 may have a first spacing between the adjacent electrode fingers among the first electrode fingers 206 (such as between the first electrode finger 218 and the first hammer head electrode finger 216). The second electrode fingers 248 of the second electrode structure 220 may have a second spacing between the adjacent electrode fingers among the second electrode fingers 248 (such as between the second electrode finger 252 and the second hammer head electrode finger 250). The first electrode finger 218 may be spaced from the second electrode finger 252 by a third spacing different from the first spacing and the second spacing, and in certain cases, the third spacing may be less than at least one of the first spacing or the second spacing. In such a case, the first electrode finger 218 and/or the second electrode finger 252 may be formed without one or more piston-mode hammer heads.

The hammer head electrode fingers (e.g., the first hammer head electrode finger 216) may have an alternative or additional structural characteristic that are different in the second and third regions 212, 214 than in the first region 210. For example, additional mass loading may be applied to the electrode fingers in the second and third regions 212, 214, such as using a different conductive material in the second and third regions 212, 214 than in the first region 210 for the electrode fingers. In certain cases, additional or alternative dielectric layers may be arranged above or below the second and third regions 212, 214 than in the first region 210. With respect to the electroacoustic device 200, a width or height for the first hammer head electrode finger 216 that is different in the first region 210 than in the second region 212 and/or third region 214 may refer to these alternative or additional structural characteristics for the waveguide regions, such as mass loading the electrodes or changing the layers above or below the electrodes. The hammer head electrode fingers in the other electrode structures may also have an alternative or additional structural characteristic that are different in the second and third regions 212, 214 than in the first region 210.

Figure 3:
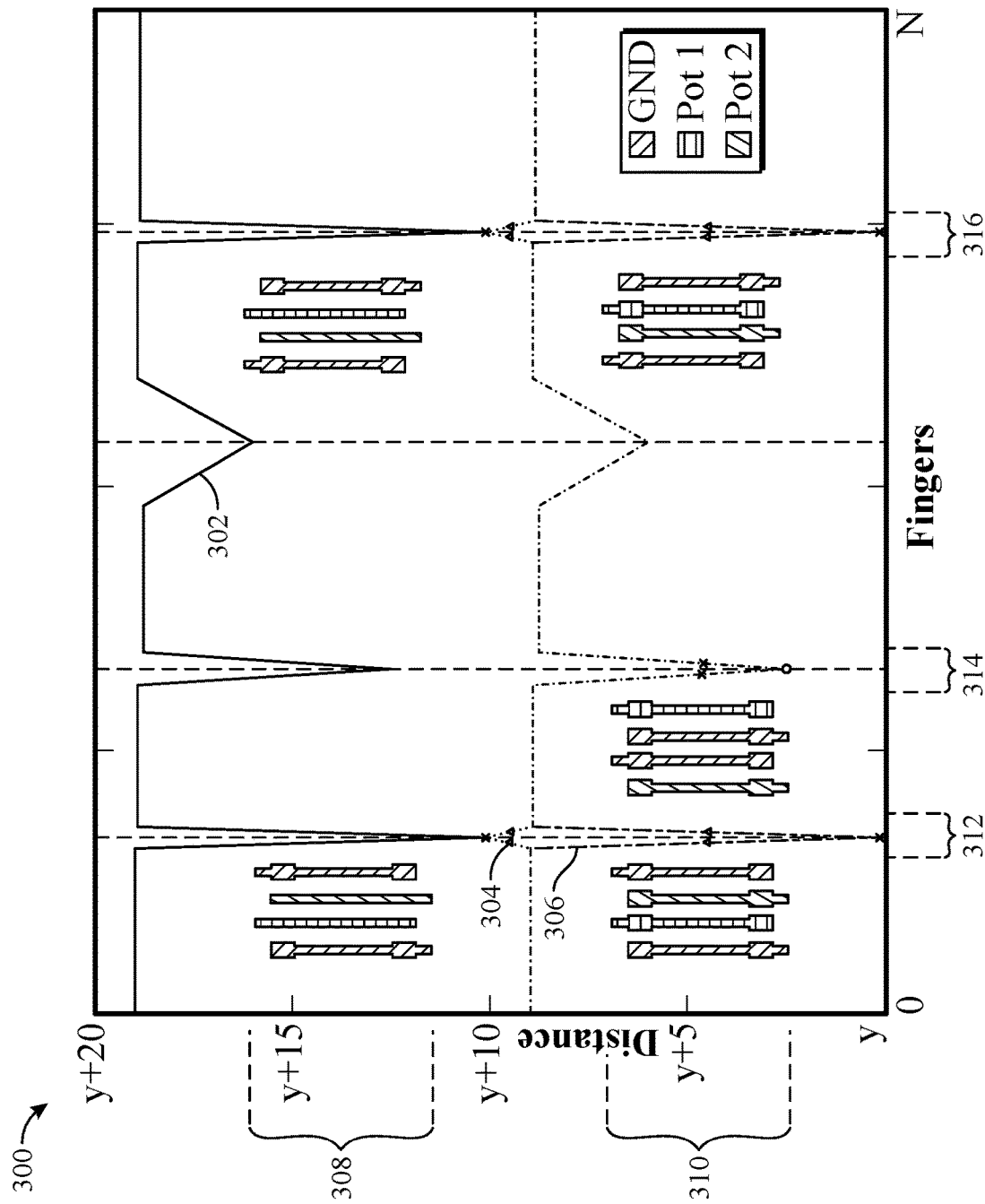
FIG. 3 is a graph illustrating various transition regions of an example electroacoustic device where electrode fingers may be configured without piston-mode hammer heads, in accordance with certain aspects of the present disclosure.

FIG. 3 is a graph 300 illustrating various example transition regions (IDT-IDT or IDT-reflector) where electrode fingers may be configured without hammer heads, in accordance with certain aspects of the present disclosure. The curves 302, 304, 306 represent the distance to an adjacent electrode finger (e.g., a distance within a range of y to y+20) at a given electrode finger (e.g., 0 to N electrode fingers) within certain regions of an active region (e.g., the active region 208). For example, the curve 302 represents the distance to an adjacent electrode finger within the region between the piston-mode waveguide (e.g., the first region 210), and the curves 304, 306 represent the distance to an adjacent electrode at the piston-mode waveguide (e.g., the second region 212 and/or the third region 214). The curve 304 represents the distances of an electroacoustic device with certain transition regions (such as transition regions 312, 316) where electrode fingers are configured without hammer heads as shown by the electrode finger diagrams 308, whereas the curve 306 represents the distances of an electroacoustic device with transition regions where the hammer heads remain as shown by the electrode finger diagrams 310. The electrode finger diagrams 308, 310 depict the electric potential of electrode fingers in the transition regions 312, 314, 316. In aspects, the adjacent electrode fingers in the transition regions 312, 316 have different electric potentials, whereas the adjacent electrode fingers in the transition region 314 has the same ground potential.

The curves 304, 306 demonstrate the difference in electrode distance in the transition regions 312, 314, 316. For example, the curve 306 demonstrates that the transition regions 312, 316 have a shorter distance than the transition region 314. In aspects, the electroacoustic device associated with the curve 306 may be more susceptible to ESD in the transition regions 312, 316. In the transition regions 312, 316, the curve 304 has a greater distance than the curve 306, and for certain electrode fingers, the curve 304 matches the distances represented by the curve 302. These transition regions 312, 316 may enable the electroacoustic device associated with the curve 304 to have a greater ESD strength than the electroacoustic device associated with the curve 306. In the transition region 314, the curves 304, 306 may have the same distance to adjacent electrode fingers. In the case of the transition region 314, this may be due to the adjacent electrode fingers having the same electric potential in the transition region 314, where there may be little to no risk of ESD.

In designing an electroacoustic device, the distance between adjacent electrode fingers and/or electric potential of adjacent electrode fingers may determine which electrode fingers are selected to be formed without the hammer heads as described herein with respect to FIGS. 2A and 2B. For example, one or more transition regions (such as the transition regions 312, 316) with the shortest distance between adjacent electrode fingers may be selected where electrode fingers are formed without one or more hammer heads. In aspects, a threshold may be used to identify the transition regions with the shortest distance, such as a threshold percentage of the transition regions with the shortest distance or a certain number (e.g., one, five, or N−1 of N transition regions) of transition regions with the shortest distance. In certain aspects, one or more transition regions (such as the transition region 312, 316) where the adjacent electrode fingers have a different electric potential, which is not ground, may be selected where electrode fingers are formed without one or more hammer heads. In aspects, the curve 304 may represent the resulting distances after modifying the design of the electroacoustic device associated with the curve 306. That is, the curve 306 may be used to identify specific transition regions where electrode fingers are formed without hammer heads to provide a desirable ESD strength.

Figures 4A, 4B:
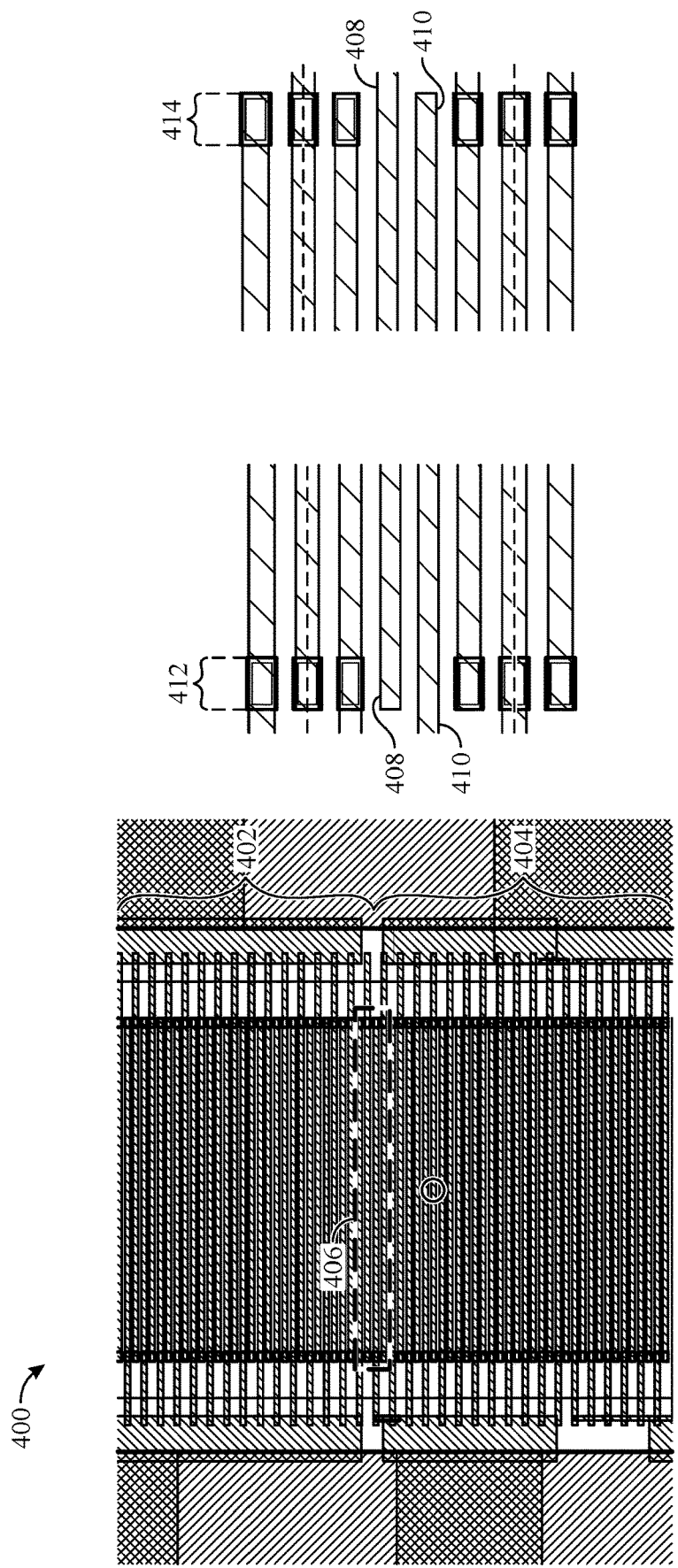
FIGS. 4A and 4B are diagrams illustrating portions of an example electroacoustic device having specific electrode fingers without piston-mode hammer heads, in accordance with certain aspects of the present disclosure.

FIGS. 4A and 4B are diagrams illustrating portions of an example electroacoustic device 400 having specific electrode fingers without piston-mode hammer heads, in accordance with certain aspects of the present disclosure. As shown, the electroacoustic device 400 includes a first electrode structure 402 disposed adjacent to a second electrode structure 404. In aspects, the first electrode structure 402 may be an IDT or a reflector grating, and the second electrode structure 404 may be an IDT. Within a transition region 406, the first electrode structure 402 may have a first electrode finger 408 disposed adjacent to a second electrode finger 410 of the second electrode structure 404. Referring to FIG. 4B, the first and second electrode fingers 408, 410 may be formed without hammer heads along the piston-mode waveguide regions 412, 414. Without the hammer heads, the first and second electrode fingers 408, 410 may enable a desirable ESD strength due in part to the increased distance between the first and second electrode fingers 408, 410.

FIGS. 5A-5F are diagrams of example transition regions where electrode fingers have various piston-mode waveguide arrangements that may enable a desirable ESD strength, in accordance with certain aspects of the present disclosure.

Figure 5A:
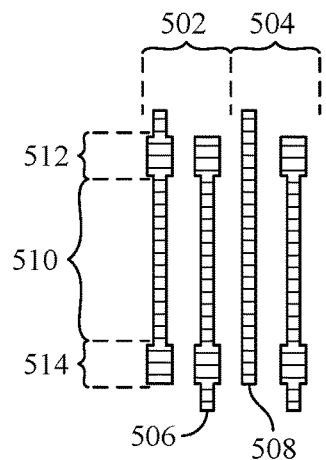
FIGS. 5A-5F are diagrams of example transition regions where electrode fingers have various piston-mode waveguide arrangements, in accordance with certain aspects of the present disclosure.

In certain aspects, one of the adjacent electrode fingers may be configured without hammer heads within a transition region. Referring to FIG. 5A, a first electrode structure 502 is disposed adjacent to a second electrode structure 504. In aspects, the first electrode structure 502 may be an IDT or a reflector grating, and the second electrode structure 504 may be an IDT. The first electrode structure 502 has a first electrode finger 506 disposed adjacent to a second electrode finger 508 of the second electrode structure 504. In this example, the first electrode finger 506 may have a greater width or height in a second region 512 and a third region 514 than in a first region 510. In other words, the first electrode finger 506 has a different width and/or a different height in the first region 510 than in the second region 512 and the third region 514. The second electrode finger 508 may have the same width and height in the first region 510, the second region 512, and the third region 514. That is, the second electrode finger 508 may have a width or height in the second region 514 and the third region 514 that is less than a corresponding width or height of the first electrode finger 506 in the second region 514 and the third region 514.

Figure 5B:
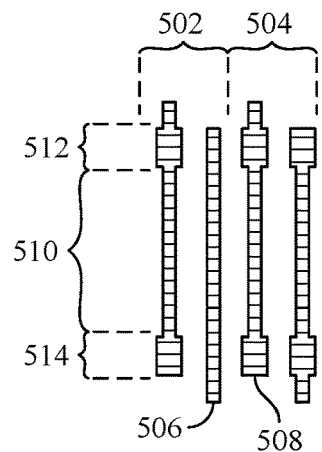

Referring to FIG. 5B, the first electrode finger 506 has a same width and height in the first region 510, the second region 512, and the third region 514, and the second electrode finger 508 has a different width and/or a different height in the first region 510 than in the second region 512 and the third region 514. In other words, the first electrode finger 506 has a width or height in the second region 514 and the third region 514 that is less than a corresponding width or height of the second electrode finger 508 in the second region 514 and the third region 514.

Figure 5C:
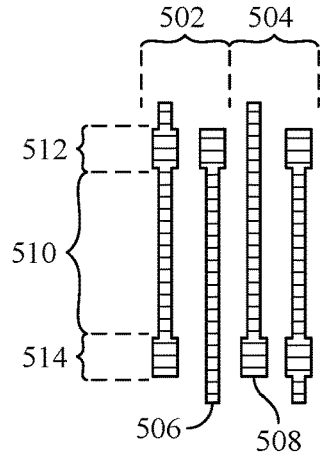

In certain aspects, the lack of a hammer head among adjacent electrode fingers may alternate between the piston-mode waveguide regions. Referring to FIG. 5C, the first electrode finger 506 has a same width and height in the third region 514 and the first region 510 and a different width and/or a different height in the second region 512 than in the first region 510, and the second electrode finger 508 has a same width and height in the first region 510 and the second region 512 and a different width and/or a different height in the third region 514 than in the first region 510. That is, the first electrode finger 506 has a width or height in the third region 514 that is less than a corresponding width or height of the second electrode finger 508 in the third region 514, and the second electrode finger has a width or height in the second region 512 that is less than a corresponding width or height of the second electrode finger 508 in the second region 512.

Figure 5D:
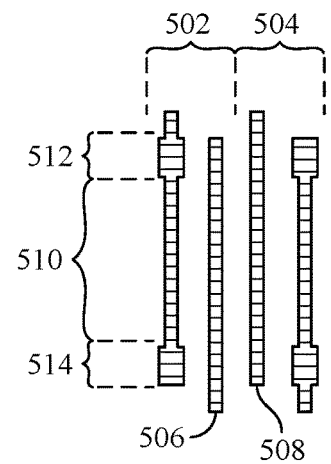

In certain aspects, both of the adjacent electrode fingers may be configured without hammer heads within a transition region. Referring to FIG. 5D, the first electrode finger 506 has a same width and height in the first region 510, the second region 512, and the third region 514, and the second electrode finger 508 has a same width and height in the first region 510, the second region 512, and the third region 514. In other words, the first electrode finger 506 has a width or height in the second region 512 and the third region 514 that is less than a corresponding width or height of another electrode finger in the second region 512 and the third region 514. The second electrode finger 508 also has a width or height in the second region 512 and the third region 514 that is less than a corresponding width or height of another electrode finger in the second region 512 and the third region 514.

Figure 5E:
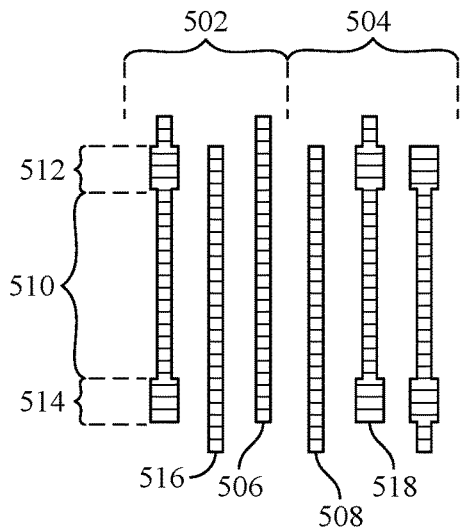

In certain aspects, other electrode fingers may be configured without hammer heads within a transition region. Referring to FIG. 5E, the first and second electrode fingers 506, 508 may be configured without hammer heads in the second and third regions 512, 514. The first electrode structure 502 may include a third electrode finger 516 arranged adjacent to the first electrode finger 506. The third electrode finger 516 may have the same width and height in the first region 510 and in at least one of the second region 512 or the third region 514. As shown, the third electrode finger 516 is configured without hammer heads in the second and third regions 512, 514. The second electrode structure 504 may include a fourth electrode finger 518 adjacent to the second electrode finger 508, where the fourth electrode finger 518 may have hammer heads in the second and third regions 512, 514.

Figure 5F:
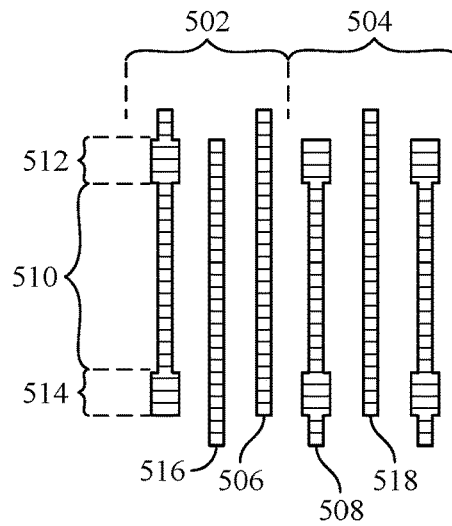

Referring to FIG. 5F, the first, third, and fourth electrode fingers 506, 516, 518 may be configured without hammer heads in the second and third regions 512, 514. The second electrode finger 508 may be configured with hammer heads in the second and third regions 512, 514. That is, the second electrode finger 508 may have a different width and/or a different height in the first region 510 than in the second region 512 and the third region 514. The first, third, and fourth electrode fingers 506, 516, 518 may have the same width and height in the first region 510, the second region 512, and the third region 514. That is, the first, third, and fourth electrode fingers 506, 516, 518 may have a width or height in the second region 512 and the third region 514 that is less than a corresponding width or height of the second electrode finger 508 in the second region 512 and the third region 514.

The piston-mode waveguide arrangements illustrated in FIGS. 5A-5F are merely examples to facilitate understanding of the present disclosure. Various aspects of piston-mode waveguide arrangements in the transition regions and/or other regions may be combined or modified in addition to or instead of the examples illustrated. While the examples depicted in FIGS. 5A-5F are described herein with respect to the piston-mode waveguide arrangements being arranged in a transition region to facilitate understanding, aspects of the present disclosure may also be applied to the selective withdrawal of hammer-heads in other regions, such as in an internal or intermediate region of an electrode structure.

Figure 6:
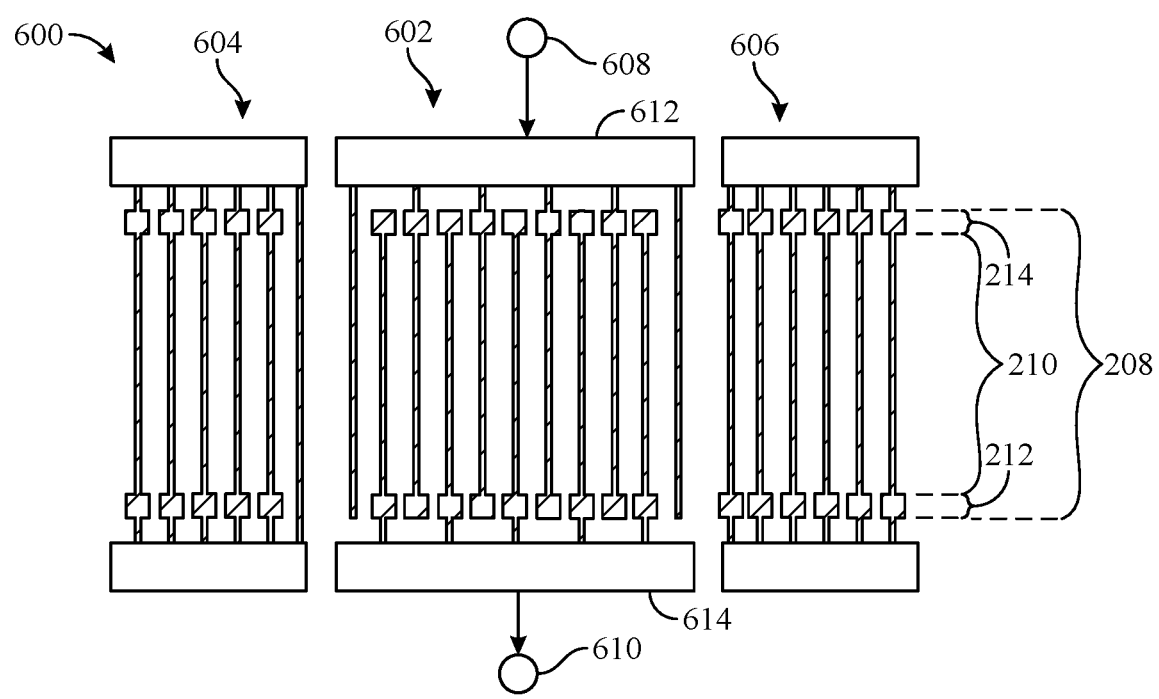
FIG. 6 is a diagram illustrating another example electroacoustic device having specific electrode fingers without piston-mode hammer heads, in accordance with certain aspects of the present disclosure.

In certain aspects, the electroacoustic device may be implemented with a single IDT. FIG. 6 is a diagram illustrating a top view of an example electroacoustic device 600 having specific electrode fingers without piston-mode hammer heads, in accordance with certain aspects of the present disclosure. The electroacoustic device 600 includes an IDT 602 arranged between a first reflector 604 and a second reflector 606. An electrical input terminal 608 may be electrically coupled to a first bus bar 612 of the IDT 602, and an electrical output terminal 610 may be electrically coupled to a second bus bar 614 of the IDT 602. In this example, the IDT 602 and the first reflector 604 have electrode fingers without hammer heads in the IDT-reflector transition between the IDT 602 and the first reflector 604, and the IDT 602 has another electrode finger with hammer heads in the IDT-reflector transition between the IDT 602 and the second reflector 606.

Figure 7:
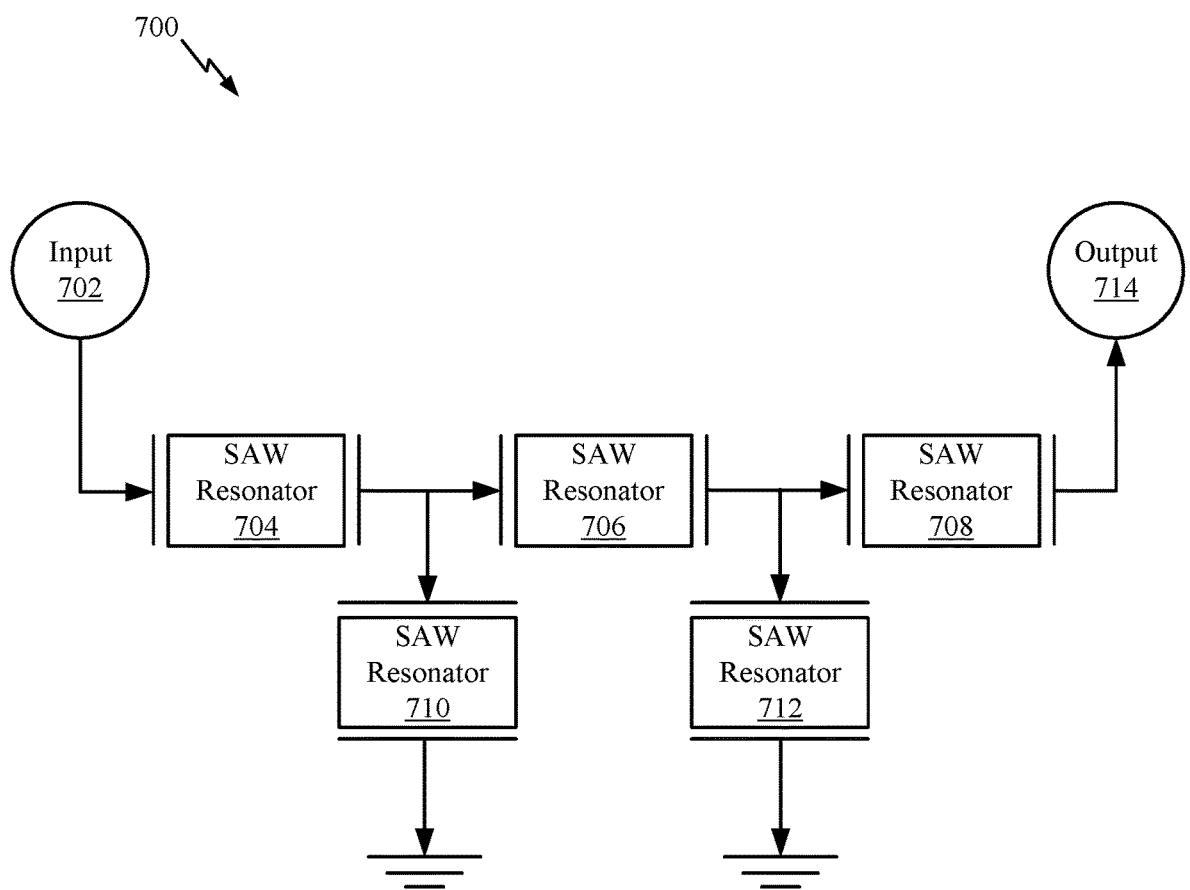
FIG. 7 is a schematic diagram of an example electroacoustic filter circuit that may include the electroacoustic device of FIG. 2A, FIG. 4A, or FIG. 6, in accordance with certain aspects of the present disclosure.

In certain cases, the electroacoustic device(s) described herein may be implemented in an electroacoustic filter. For example, FIG. 7 is a schematic diagram of an electroacoustic filter circuit 700 that may include an electroacoustic device having specific electrode fingers without piston-mode hammer heads (such as the electroacoustic device 200). The filter circuit 700 provides one example of where the electroacoustic device 200 may be used. The filter circuit 700 includes an input terminal 702 and an output terminal 714. Between the input terminal 702 and the output terminal 714, a ladder-type network of SAW resonators is provided. The filter circuit 700 includes a first SAW resonator 704, a second SAW resonator 706, and a third SAW resonator 708 all electrically connected in series between the input terminal 702 and the output terminal 714. A fourth SAW resonator 710 (e.g., shunt resonator) has a first terminal connected between the first SAW resonator 704 and the second SAW resonator 706 and a second terminal connected to a ground potential node. A fifth SAW resonator 712 (e.g., shunt resonator) has a first terminal connected between the second SAW resonator 706 and the third SAW resonator 708 and a second terminal connected to the ground potential node. In certain cases, the fourth or fifth SAW resonator 710, 712 may be connected to the ground potential node via other circuit elements (such as an inductor, capacitor, or a combination thereof). The electroacoustic filter circuit 700 may, for example, be a bandpass circuit having a passband with a selected frequency range (e.g., in a frequency range between 500 MHz and 7 GHz).

Figure 8:
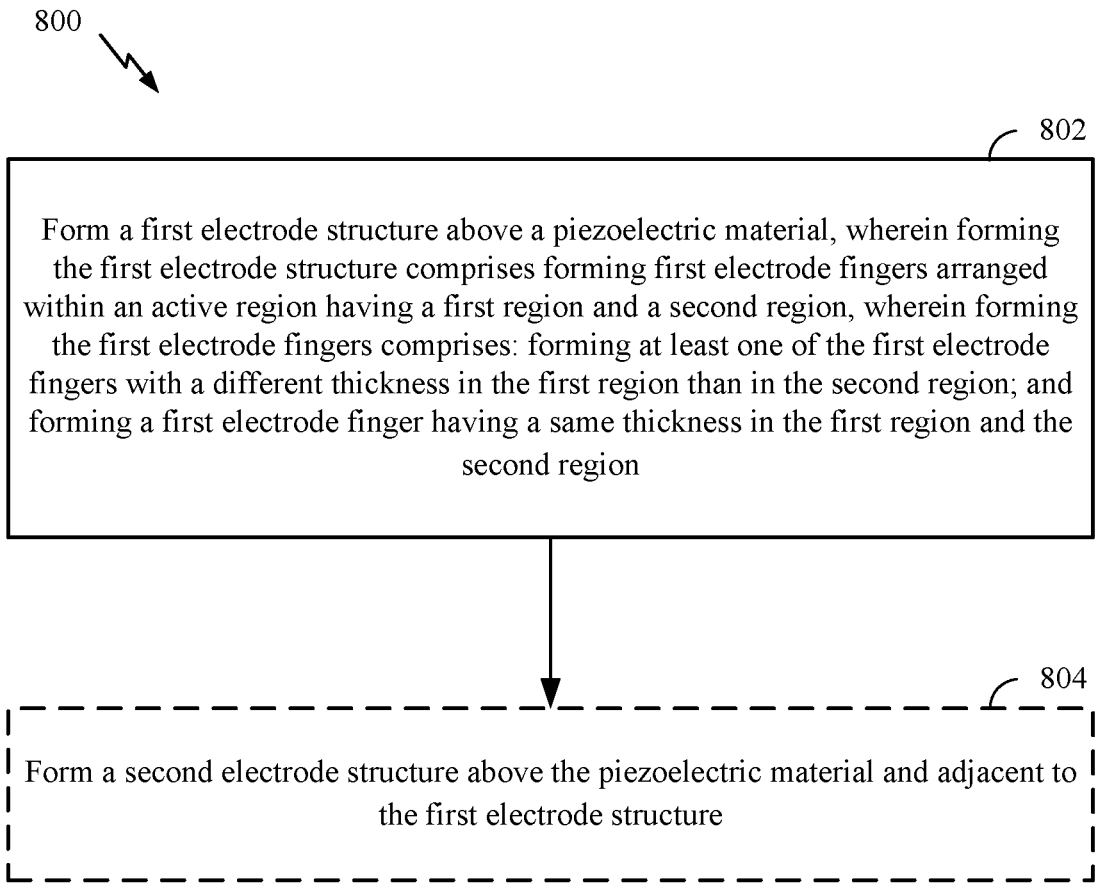
FIG. 8 is a flow diagram illustrating example operations for fabricating an electroacoustic device, in accordance with certain aspects of the present disclosure.

FIG. 8 is a flow diagram illustrating example operations 800 for fabricating an electroacoustic device (e.g., the electroacoustic device 200), in accordance with certain aspects of the present disclosure. The operations 800 may be performed, for example, by an electroacoustic device fabrication facility.

The operations 800 may begin, at block 802, by forming a first electrode structure (e.g., the first electrode structure 204) above a piezoelectric material (e.g., the piezoelectric material 202). Formation of the first electrode structure may include forming first electrode fingers (e.g., the first electrode fingers 206) arranged within an active region (e.g., the active region 208) having a first region (e.g., the first region 210) and a second region (e.g., the second region 212). Formation of the first electrode fingers may include forming at least one of the first electrode fingers (e.g., the first hammer head electrode finger 216) with a different width and/or a different height in the first region than in the second region and forming a first electrode finger (e.g., the first electrode finger 218) having the same width and height in the first region and the second region. In certain aspects, formation of the first electrode finger at block 802 may include forming the first electrode finger having a width and/or a height in the second region that is less than a corresponding width and/or height of another electrode finger in the second region.

Formation of the first electrode finger at block 802 may involve an additive or subtractive process. In certain aspects, the first electrode finger may be formed without one or more hammer heads via deposition of the conductive material through selective patterning. For example, the first electrode fingers may all be formed without hammer heads, and an additive process may be performed to selectively deposit additional conductive material for the hammer heads among a subset of the first electrode fingers. In certain cases, the first electrode fingers may all be formed with hammer heads, and the first electrode finger may be formed without one or more hammer heads through a subtractive process. For example, one or more hammer heads may be selectively removed from certain electrode fingers among the first electrode fingers. As used herein, an electrode finger formed without a hammer head may refer to these additive or subtractive processes.

At block 804, a second electrode structure (e.g., the second electrode structure 220) may be formed above the piezoelectric material and adjacent to the first electrode structure. Formation of the second electrode structure may include forming second electrode fingers (e.g., the second electrode fingers 248) arranged within the active region. Formation of the second electrode fingers may include forming at least one of the second electrode fingers (e.g., the second hammer head electrode finger 250) with a different width and/or a different height in the first region than in the second region, and forming a second electrode finger (e.g., the second electrode finger 252) adjacent to the first electrode finger, where the second electrode finger may be one of the second electrode fingers.

In certain aspects, the first electrode structure may be an IDT, such that the first electrode fingers are arranged in an interdigitated manner at block 802. In certain aspects, the second electrode structure may be an IDT or a reflector grating.

In certain aspects, hammer heads may be formed in a piston-mode waveguide structure along the first electrode fingers and/or the second electrode fingers. For example, the active region may include a third region (e.g., the third region 214). The first region may be disposed between the second region and the third region. Formation of the first electrode fingers at block 802 may include forming a majority of the first electrode fingers and/or a majority of the second electrode fingers to have a greater width and a greater height in the second region and the third region than in the first region, such that the first electrode structure comprises a piston-mode electrode structure, for example, as depicted in FIG. 2A.

Figure 9:
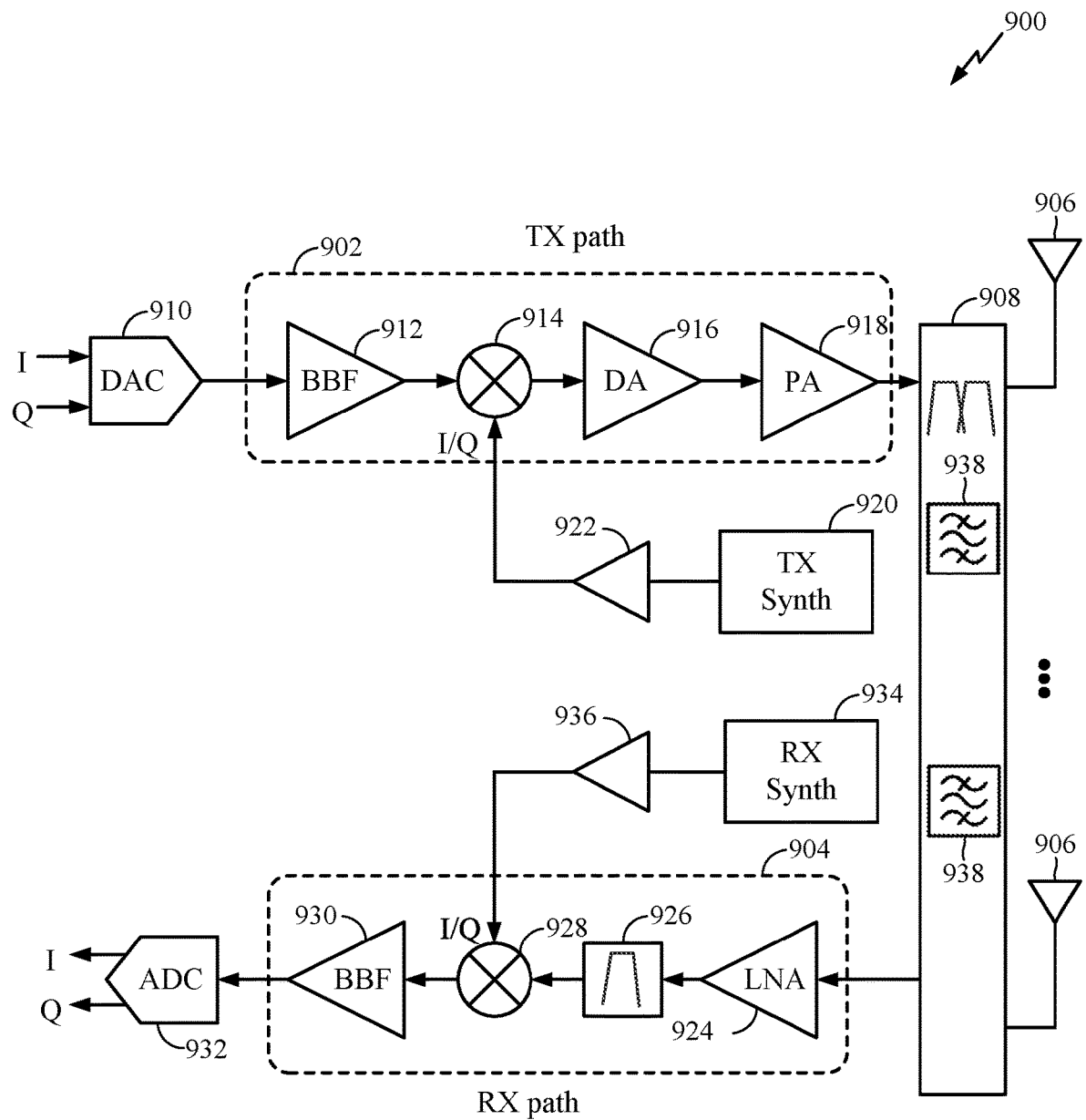
FIG. 9 is a diagram of an example transceiver in which the electroacoustic filter of FIG. 7 may be employed, in accordance with certain aspects of the present disclosure.

In certain aspects, the electroacoustic device described herein may be employed in various circuits (such as a radio frequency (RF) transceiver), for example, to serve as an electroacoustic filter or duplexer. FIG. 9 is a block diagram of an example RF transceiver 900, in accordance with certain aspects of the present disclosure. The RF transceiver 900 includes at least one transmit (TX) path 902 (also known as a transmit chain) for transmitting signals via one or more antennas 906 and at least one receive (RX) path 904 (also known as a receive chain) for receiving signals via the antennas 906. When the TX path 902 and the RX path 904 share an antenna 906, the paths may be connected with the antenna via an interface 908, which may include any of various suitable RF devices, such as an electroacoustic filter 938 (e.g., the electroacoustic filter circuit 700), a duplexer (which may include a SAW resonator), a diplexer, a multiplexer, and the like.

Receiving in-phase (I) or quadrature (Q) baseband analog signals from a digital-to-analog converter (DAC) 910, the TX path 902 may include a baseband filter (BBF) 912, a mixer 914, a driver amplifier (DA) 916, and a power amplifier (PA) 918. In certain aspects, the BBF 912, the mixer 914, and the DA 916 may be included in a semiconductor device such as a radio frequency integrated circuit (RFIC), whereas the PA 918 may be external to this semiconductor device.

The BBF 912 filters the baseband signals received from the DAC 910, and the mixer 914 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 914 are typically RF signals, which may be amplified by the DA 916 and/or by the PA 918 before transmission by the antenna 906. In certain cases, the BBF 912 may be implemented using an electroacoustic filter with a SAW resonator (e.g., the electroacoustic filter circuit 700).

The RX path 904 may include a low noise amplifier (LNA) 924, a filter 926, a mixer 928, and a baseband filter (BBF) 930. The LNA 924, the filter 926, the mixer 928, and the BBF 930 may be included in a RFIC, which may or may not be the same RFIC that includes the TX path components. RF signals received via the antenna 906 may be amplified by the LNA 924 and filtered by the filter 926, and the mixer 928 mixes the amplified RF signals with a receive local oscillator (LO) signal to convert the RF signal of interest to a different baseband frequency (e.g., downconvert). The baseband signals output by the mixer 928 may be filtered by the BBF 930 before being converted by an analog-to-digital converter (ADC) 932 to digital I or Q signals for digital signal processing. In certain cases, the filter 926 and/or BBF 930 may be implemented using an electroacoustic filter with a SAW resonator (e.g., the electroacoustic filter circuit 700).

Some systems may employ frequency synthesizers with a voltage-controlled oscillator (VCO) to generate a stable, tunable LO with a particular tuning range. Thus, the transmit LO may be produced by a TX frequency synthesizer 920, which may be buffered or amplified by amplifier 922 before being mixed with the baseband signals in the mixer 914. Similarly, the receive LO may be produced by an RX frequency synthesizer 934, which may be buffered or amplified by amplifier 936 before being mixed with the RF signals in the mixer 928.

Figure 10:
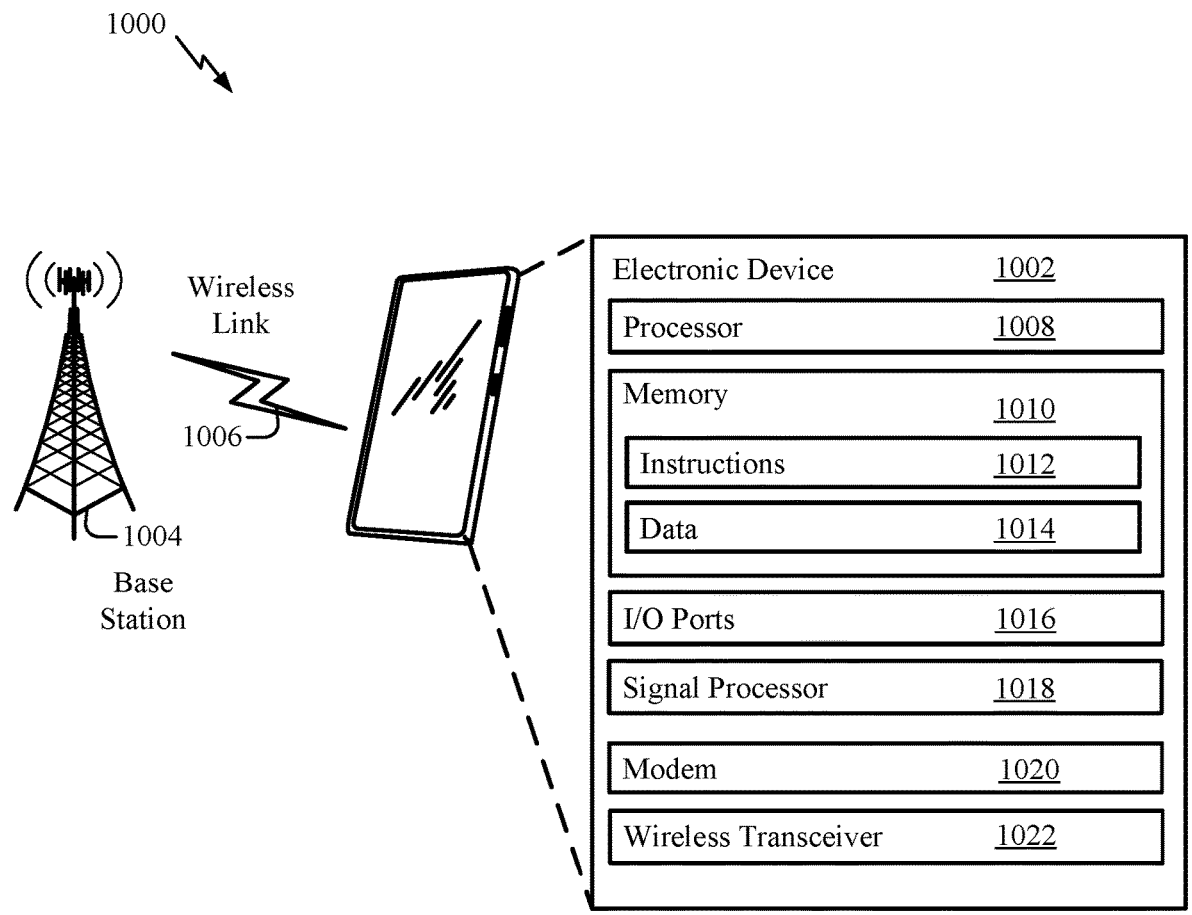
FIG. 10 is a diagram of a wireless communication network that includes a wireless communication device having a transceiver such as the transceiver of FIG. 9, in accordance with certain aspects of the present disclosure.

FIG. 10 is a diagram of an environment 1000 that includes a wireless communication device 1002, which has a wireless transceiver 1022 such as the RF transceiver 900 of FIG. 9. In the environment 1000, the wireless communication device 1002 communicates with a base station 1004 through a wireless link 1006. As shown, the wireless communication device 1002 is depicted as a smart phone. However, the electronic wireless communication device 1002 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1004 communicates with the wireless communication device 1002 via the wireless link 1006, which may be implemented as any suitable type of wireless link. Although depicted as a base station tower of a cellular radio network, the base station 1004 may represent or be implemented as another device, such as a satellite, terrestrial broadcast tower, access point, peer-to-peer device, mesh network node, fiber optic line, another electronic device generally as described above, and so forth. Hence, the wireless communication device 1002 may communicate with the base station 1004 or another device via a wired connection, a wireless connection, or a combination thereof. The wireless link 1006 can include a downlink of data or control information communicated from the base station 1004 to the wireless communication device 1002 and an uplink of other data or control information communicated from the wireless communication device 1002 to the base station 1004. The wireless link 1006 may be implemented using any suitable communication protocol or standard, such as 3rd Generation Partnership Project Long-Term Evolution (3GPP LTE), 3GPP New Radio Fifth Generation (NR 5G), IEEE 802.11 (WiFi), IEEE 802.16 (WiMAX), Bluetooth™ and so forth.

The wireless communication device 1002 includes a processor 1008 and a memory 1010. The memory 1010 may be or form a portion of a computer readable storage medium. The processor 1008 may include any type of processor, such as an application processor or a multi-core processor, that is configured to execute processor-executable instructions (e.g., code) stored by the memory 1010. The memory 1010 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1010 is implemented to store instructions 1012, data 1014, and other information of the wireless communication device 1002, and thus when configured as or part of a computer readable storage medium, the memory 1010 does not include transitory propagating signals or carrier waves. That is, the memory 1010 may include non-transitory computer-readable media (e.g., tangible media).

The wireless communication device 1002 may also include input/output ports 1016. The I/O ports 1016 enable data exchanges or interaction with other devices, networks, or users or between components of the device.

The wireless communication device 1002 may further include a signal processor (SP) 1018 (e.g., such as a digital signal processor (DSP)). The signal processor 1018 may function similar to the processor 1008 and may be capable of executing instructions and/or processing information in conjunction with the memory 1010.

For communication purposes, the wireless communication device 1002 also includes a modem 1020, a wireless transceiver 1022, and an antenna (not shown). The wireless transceiver 1022 provides connectivity to respective networks and other wireless communication devices connected therewith using RF wireless signals and may include the RF transceiver 900 of FIG. 9. The wireless transceiver 1022 may facilitate communication over any suitable type of wireless network, such as a wireless local area network (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

In addition to the various aspects described above, aspects of specific combinations are within the scope of the disclosure, some of which are detailed below:

Aspect 1. An electroacoustic device, comprising: a piezoelectric material; and a first electrode structure disposed above the piezoelectric material, the first electrode structure comprising first electrode fingers arranged within an active region having a first region and a second region, wherein: at least one of the first electrode fingers has at least one of a different width or a different height in the first region than in the second region; and the first electrode fingers comprise a first electrode finger that has a width or height in the second region that is less than a corresponding width or height of the at least one of the first electrode fingers in the second region.

Aspect 2. The electroacoustic device of Aspect 1, wherein the at least one of the first electrode fingers is a majority of the first electrode fingers.

Aspect 3. The electroacoustic device according to Aspect 1 or 2, wherein the first electrode fingers are arranged in an interdigitated manner.

Aspect 4. The electroacoustic according to any of Aspects 1-3, further comprising a second electrode structure disposed above the piezoelectric material and disposed adjacent to the first electrode structure, the second electrode structure comprising second electrode fingers arranged within the active region, wherein: at least one of the second electrode fingers has at least one of a different width or a different height in the first region than in the second region; and the second electrode fingers comprise a second electrode finger disposed adjacent to the first electrode finger of the first electrode structure.

Aspect 5. The electroacoustic device of Aspect 4, wherein the second electrode finger has a width or height in the second region that is less than a corresponding width or height of the at least one of the second electrode fingers in the second region.

Aspect 6. The electroacoustic device according to Aspect 4 or 5, wherein the first electrode finger is coupled to a first node configured to have a first voltage, wherein the second electrode finger is coupled to a second node configured to have a second voltage, and wherein the first voltage is different from the second voltage.

Aspect 7. The electroacoustic device of Aspect 6, wherein the first electrode fingers include a third electrode finger arranged adjacent to the first electrode finger and coupled to a third node configured to have a reference voltage and wherein the reference voltage is different from the first voltage and the second voltage.

Aspect 8. The electroacoustic device according to any of Aspects 4-7, wherein: the first electrode fingers have a first spacing between the first electrode fingers; the second electrode fingers have a second spacing between the second electrode fingers; and the first electrode finger is spaced from the second electrode by a third spacing different from the first spacing and the second spacing.

Aspect 9. The electroacoustic device of Aspect 8, wherein the third spacing is less than at least one of the first spacing or the second spacing.

Aspect 10. The electroacoustic device according to any of Aspects 4-9, wherein the second electrode structure is a reflector grating.

Aspect 11. The electroacoustic device according to any of Aspects 4-9, wherein the second electrode fingers are arranged in an interdigitated manner.

Aspect 12. The electroacoustic device according to any of Aspects 1-11, wherein the at least one of the first electrode fingers has a greater width and a greater height in the second region than in the first region.

Aspect 13. The electroacoustic device according to any of Aspects 4-12, wherein at least one of: a majority of the first electrode fingers have a greater width and a greater height in the second region than in the first region; or a majority of the second electrode fingers have a greater width and a greater height in the second region than in the first region.

Aspect 14. The electroacoustic device according to any of Aspects 1-13, wherein the electroacoustic device is a surface acoustic wave resonator.

Aspect 15. The electroacoustic according to any of Aspects 4-14, wherein: the active region comprises a third region; the first region is disposed between the second region and the third region; the at least one of the first electrode fingers has at least one of a different width or a different height in the first region than in the third region; and the at least one of the second electrode fingers has at least one of a different width or a different height in the first region than in the third region.

Aspect 16. The electroacoustic device of Aspect 15, wherein a majority of the first electrode fingers have a greater width and a greater height in the second region and the third region than in the first region such that the first electrode structure comprises a piston-mode electrode structure.

Aspect 17. The electroacoustic device of Aspect 15, wherein: the first electrode finger has a width or height in the second region and the third region that is less than a corresponding width or height of the at least one of the first electrode fingers in the second region and the third region; and the second electrode finger has at least one of a different width or a different height in the first region than in the second region and the third region.

Aspect 18. The electroacoustic device of Aspect 15, wherein: the first electrode finger has a width or height in the second region that is less than a corresponding width or height of the at least one of the first electrode fingers in the second region and a different width or height in the first region than in the third region; and the second electrode finger has a width or height in the third region that is less than a corresponding width or height of the at least one of the second electrode fingers in the third region and a different width or height in the first region than in the second region.

Aspect 19. The electroacoustic device of Aspect 15, wherein: the first electrode finger has a width or height in the second region and the third region that is less than a corresponding width or height of the at least one of the first electrode fingers in the second region and the third region; and the second electrode finger has a width or height in the second region and the third region that is less than a corresponding width or height of the at least one of the second electrode fingers in the second region and the third region.

Aspect 20. The electroacoustic device of Aspect 15, further comprising a third electrode finger arranged adjacent to the first electrode finger or the second electrode finger, wherein the third electrode finger has a width or height in in at least one of the second region or the third region that is less than a corresponding width or height of another electrode finger in the second region or the third region.

Aspect 21. The electroacoustic device of Aspect 20, further comprising a fourth electrode finger arranged adjacent to the second electrode finger, wherein: the first electrode finger has at least one of a different width or a different height in the first region than in the second region and the third region; the second electrode finger has a width or height in the second region and the third region that is less than a corresponding width or height of the at least one of the second electrode fingers in the second region and the third region; the third electrode finger is arranged adjacent to the first electrode finger; and the fourth electrode finger has a width or height in at least one of the second region or the third region that is less than a corresponding width or height of the other electrode finger in the second region or the third region.

Aspect 22. An electroacoustic device, comprising: a piezoelectric material; and a first electrode structure disposed above the piezoelectric material, the first electrode structure comprising first electrode fingers arranged within an active region having a first region and a second region, wherein a width or height for at least one of the first electrode fingers is different in the first region than in the second region, and wherein the first electrode fingers comprise a first electrode finger where a width or height in the second region for the first electrode finger is less than a corresponding width or height in the second region for the at least one of the first electrode fingers.

Aspect 23. The electroacoustic device of Aspect 22, further comprising a second electrode structure disposed above the piezoelectric material and disposed adjacent to the first electrode structure, the second electrode structure comprising second electrode fingers arranged within the active region, wherein a width or height for at least one of the second electrode fingers is different in the first region than in the second region, and wherein the second electrode fingers comprise a second electrode finger disposed adjacent to the first electrode finger of the first electrode structure.

Aspect 24. The electroacoustic device of Aspect 23, wherein the second electrode finger has a width or height in the second region that is less than a corresponding width or height of the at least one of the second electrode fingers in the second region.

Aspect 25. The electroacoustic device according to Aspect 23 or 24, wherein: the active region comprises a third region; the first region is disposed between the second region and the third region; the at least one of the first electrode fingers has at least one of a different width or a different height in the first region than in the third region; and the at least one of the second electrode fingers has at least one of a different width or a different height in the first region than in the third region.

Aspect 26. The electroacoustic device according to any of Aspects 23-25, wherein: the first electrode finger has a width or height in the second region that is less than a corresponding width or height of the at least one of the first electrode fingers in the second region and has at least one of a different width or a different height in the first region than in the third region; and the second electrode finger has a width or height in the third region that is less than a corresponding width or height of the at least one of the second electrode fingers in the third region and has at least one of a different width or a different height in the first region than in the second region.

Aspect 27. A method of fabricating an electroacoustic device, comprising: forming a first electrode structure above a piezoelectric material, wherein forming the first electrode structure comprises forming first electrode fingers arranged within an active region having a first region and a second region, wherein forming the first electrode fingers comprises: forming at least one of the first electrode fingers with at least one of a different width or a different height in the first region than in the second region; and forming a first electrode finger having a width or height in the second region that is less than a corresponding width or height of the at least one of the first electrode fingers in the second region.

Aspect 28. The method of Aspect 27, wherein forming the first electrode fingers comprises forming the first electrode fingers arranged in an interdigitated manner.

Aspect 29. The method of Aspect 28, further comprising: forming a second electrode structure above the piezoelectric material and adjacent to the first electrode structure, wherein forming the second electrode structure comprises forming second electrode fingers arranged within the active region, wherein forming the second electrode fingers comprises: forming at least one of the second electrode fingers with at least one of a different width or a different height in the first region than in the second region; and forming a second electrode finger adjacent to the first electrode finger, the second electrode finger being one of the second electrode fingers.

Aspect 30. The method of Aspect 29, wherein: the active region comprises a third region; the first region is disposed between the second region and the third region; and forming the first electrode fingers comprises forming a majority of the first electrode fingers to have a greater width and a greater height in the second region and the third region than in the first region, such that the first electrode structure comprises a piston-mode electrode structure.

The following description provides examples of an electroacoustic device for various filtering applications, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An electroacoustic device, comprising:
   a piezoelectric material;
   a first electrode structure disposed above the piezoelectric material, the first electrode structure comprising first electrode fingers arranged within an active region having a first region and a second region, wherein:
   at least one of the first electrode fingers has at least one of a different width or a different height in the first region than in the second region; and
   the first electrode fingers comprise a first electrode finger that has a width or height in the second region that is less than a corresponding width or height of the at least one of the first electrode fingers in the second region, and
   a second electrode structure disposed above the piezoelectric material and disposed adjacent to the first electrode structure, the second electrode structure comprising second electrode fingers arranged within the active region, wherein:
   at least one of the second electrode fingers has at least one of a different width or a different height in the first region than in the second region; and
   the second electrode fingers comprise a second electrode finger disposed adjacent to the first electrode finger of the first electrode structure, and wherein:
   the first electrode fingers have a first spacing between the first electrode fingers;
   the second electrode fingers have a second spacing between the second electrode fingers; and
   the first electrode finger is spaced from the second electrode finger by a third spacing different from the first spacing and the second spacing.

2. The electroacoustic device of claim 1, wherein the at least one of the first electrode fingers is a majority of the first electrode fingers.

3. The electroacoustic device of claim 1, wherein the first electrode fingers are arranged in an interdigitated manner.

4. The electroacoustic device of claim 3, wherein the electroacoustic device is a surface acoustic wave resonator.

5. The electroacoustic device of claim 1, wherein the second electrode finger has a width or height in the second region that is less than a corresponding width or height of the at least one of the second electrode fingers in the second region.

6. The electroacoustic device of claim 1, wherein the first electrode finger is coupled to a first node configured to have a first voltage, wherein the second electrode finger is coupled to a second node configured to have a second voltage, and wherein the first voltage is different from the second voltage.

7. The electroacoustic device of claim 6, wherein the first electrode fingers include a third electrode finger arranged adjacent to the first electrode finger and coupled to a third node configured to have a reference voltage and wherein the reference voltage is different from the first voltage and the second voltage.

8. The electroacoustic device of claim 1, wherein the third spacing is less than at least one of the first spacing or the second spacing.

9. The electroacoustic device of claim 1, wherein the second electrode structure is a reflector grating.

10. The electroacoustic device of claim 1, wherein the second electrode fingers are arranged in an interdigitated manner.

11. The electroacoustic device of claim 1, wherein the at least one of the first electrode fingers has a greater width and a greater height in the second region than in the first region.

12. The electroacoustic device of claim 1, wherein at least one of:
   a majority of the first electrode fingers have a greater width and a greater height in the second region than in the first region; or
   a majority of the second electrode fingers have a greater width and a greater height in the second region than in the first region.

13. The electroacoustic device of claim 1, wherein:
the active region comprises a third region;
the first region is disposed between the second region and the third region;
the at least one of the first electrode fingers has at least one of a different width or a different height in the first region than in the third region; and
the at least one of the second electrode fingers has at least one of a different width or a different height in the first region than in the third region.

14. The electroacoustic device of claim 13, wherein a majority of the first electrode fingers have a greater width and a greater height in the second region and the third region than in the first region such that the first electrode structure comprises a piston-mode electrode structure.

15. The electroacoustic device of claim 13, wherein:
the first electrode finger has a width or height in the second region and the third region that is less than a corresponding width or height of the at least one of the first electrode fingers in the second region and the third region; and
the second electrode finger has at least one of a different width or a different height in the first region than in the second region and the third region.

16. The electroacoustic device of claim 13, wherein:
the first electrode finger has a width or height in the second region that is less than a corresponding width or height of the at least one of the first electrode fingers in the second region and a different width or height in the first region than in the third region; and
the second electrode finger has a width or height in the third region that is less than a corresponding width or height of the at least one of the second electrode fingers in the third region and a different width or height in the first region than in the second region.

17. The electroacoustic device of claim 13, wherein:
the first electrode finger has a width or height in the second region and the third region that is less than a corresponding width or height of the at least one of the first electrode fingers in the second region and the third region; and
the second electrode finger has a width or height in the second region and the third region that is less than a corresponding width or height of the at least one of the second electrode fingers in the second region and the third region.

18. The electroacoustic device of claim 13, further comprising a third electrode finger arranged adjacent to the first electrode finger or the second electrode finger, wherein the third electrode finger has a width or height in at least one of the second region or the third region that is less than a corresponding width or height of another electrode finger in the second region or the third region.

19. The electroacoustic device of claim 18, further comprising a fourth electrode finger arranged adjacent to the second electrode finger, wherein:
the first electrode finger has at least one of a different width or a different height in the first region than in the second region and the third region;
the second electrode finger has a width or height in the second region and the third region that is less than a corresponding width or height of the at least one of the second electrode fingers in the second region and the third region;
the third electrode finger is arranged adjacent to the first electrode finger; and
the fourth electrode finger has a width or height in at least one of the second region or the third region that is less than a corresponding width or height of the other electrode finger in the second region or the third region.

20. A method of fabricating an electroacoustic device, comprising:
forming a first electrode structure above a piezoelectric material, wherein forming the first electrode structure comprises forming first electrode fingers arranged within an active region having a first region and a second region, wherein forming the first electrode fingers comprises:
forming at least one of the first electrode fingers with at least one of a different width or a different height in the first region than in the second region; and
forming a first electrode finger having a width or height in the second region that is less than a corresponding width or height of the at least one of the first electrode fingers in the second region; and
forming a second electrode structure above the piezoelectric material and adjacent to the first electrode structure, wherein forming the second electrode structure comprises forming second electrode fingers arranged within the active region, wherein forming the second electrode fingers comprises:
forming at least one of the second electrode fingers with at least one of a different width or a different height in the first region than in the second region; and
forming a second electrode finger adjacent to the first electrode finger of the first electrode structure, wherein:
the first electrode fingers are formed to have a first spacing between the first electrode fingers;
the second electrode fingers are formed to have a second spacing between the second electrode fingers; and
the first electrode finger is formed to be spaced from the second electrode finger by a third spacing different from the first spacing and the second spacing.

21. The method of claim 20, wherein forming the first electrode fingers comprises forming the first electrode fingers arranged in an interdigitated manner.

22. The method of claim 20, wherein:
the active region comprises a third region;
the first region is disposed between the second region and the third region; and
forming the first electrode fingers comprises forming a majority of the first electrode fingers to have a greater width and a greater height in the second region and the third region than in the first region, such that the first electrode structure comprises a piston-mode electrode structure.

23. An electroacoustic device, comprising:
a piezoelectric material;
a first electrode structure disposed above the piezoelectric material, the first electrode structure comprising first electrode fingers arranged within an active region having a first region and a second region, wherein:
at least one of the first electrode fingers has at least one of a different width or a different height in the first region than in the second region; and
the first electrode fingers comprise a first electrode finger that has a width or height in the second region that is less than a corresponding width or height of the at least one of the first electrode fingers in the second region; and
a second electrode structure disposed above the piezoelectric material and disposed adjacent to the first electrode structure, the second electrode structure comprising second electrode fingers arranged within the active region, wherein:
- at least one of the second electrode fingers has at least one of a different width or a different height in the first region than in the second region; and
- the second electrode fingers comprise a second electrode finger disposed adjacent to the first electrode finger of the first electrode structure,
- wherein the second electrode structure is a reflector grating.

24. The electroacoustic device of claim 23, wherein the at least one of the first electrode fingers is a majority of the first electrode fingers.

25. The electroacoustic device of claim 23, wherein the first electrode fingers are arranged in an interdigitated manner.

26. An electroacoustic device, comprising:
- a piezoelectric material;
- a first electrode structure disposed above the piezoelectric material, the first electrode structure comprising first electrode fingers arranged within an active region having a first region and a second region, wherein:
  - at least one of the first electrode fingers has at least one of a different width or a different height in the first region than in the second region; and
  - the first electrode fingers comprise a first electrode finger that has a width or height in the second region that is less than a corresponding width or height of the at least one of the first electrode fingers in the second region,
- a second electrode structure disposed above the piezoelectric material and disposed adjacent to the first electrode structure, the second electrode structure comprising second electrode fingers arranged within the active region, wherein:
  - at least one of the second electrode fingers has at least one of a different width or a different height in the first region than in the second region; and
  - the second electrode fingers comprise a second electrode finger disposed adjacent to the first electrode finger of the first electrode structure, wherein:
    - the active region comprises a third region;
    - the first region is disposed between the second region and the third region;
    - the at least one of the first electrode fingers has at least one of a different width or a different height in the first region than in the third region; and
    - the at least one of the second electrode fingers has at least one of a different width or a different height in the first region than in the third region; and
  - a third electrode finger arranged adjacent to the first electrode finger or the second electrode finger, wherein the third electrode finger has a width or height in at least one of the second region or the third region that is less than a corresponding width or height of another electrode finger in the second region or the third region.

27. The electroacoustic device of claim 26, further comprising a fourth electrode finger arranged adjacent to the second electrode finger, wherein:
- the first electrode finger has at least one of a different width or a different height in the first region than in the second region and the third region;
- the second electrode finger has a width or height in the second region and the third region that is less than a corresponding width or height of the at least one of the second electrode fingers in the second region and the third region;
- the third electrode finger is arranged adjacent to the first electrode finger; and
- the fourth electrode finger has a width or height in at least one of the second region or the third region that is less than a corresponding width or height of the other electrode finger in the second region or the third region.

28. The electroacoustic device of claim 26, wherein the at least one of the first electrode fingers is a majority of the first electrode fingers.

29. The electroacoustic device of claim 26, wherein the first electrode fingers are arranged in an interdigitated manner.

* * * * *